(12) United States Patent
Stikvoort (10) Patent No.: US 7,190,735 B2
(45) Date of Patent: Mar. 13, 2007

(54) GENERATING TWO SIGNALS HAVING A MUTUAL PHASE DIFFERENCE OF 90°

(75) Inventor: Eduard Ferdinand Stikvoort, Eindhoven (NL)

(73) Assignee: NXP B.V., Eindhoven (NL)

( * ) Notice: Subject to any disclaimer, the term of this patent is extended or adjusted under 35 U.S.C. 154(b) by 1066 days.

(21) Appl. No.: 10/022,166

(22) Filed: Dec. 13, 2001

(65) Prior Publication Data

US 2002/0080718 A1    Jun. 27, 2002

(30) Foreign Application Priority Data

Dec. 18, 2000    (EP)    .................................. 00204631

(51) Int. Cl.
*H04L 27/18*    (2006.01)
(52) U.S. Cl. .................... 375/279; 370/210; 708/404
(58) Field of Classification Search ........ 375/259–261, 375/271, 285; 370/206, 208, 210; 708/403–404
See application file for complete search history.

(56) References Cited

U.S. PATENT DOCUMENTS

| 4,723,318 | A | | 2/1988 | Marshall ..................... 455/109 |
| 5,705,949 | A | * | 1/1998 | Alelyunas et al. .......... 329/304 |
| 5,815,804 | A | * | 9/1998 | Newell et al. ................. 455/78 |
| 6,219,375 | B1 | * | 4/2001 | Dent ........................... 375/130 |
| 6,668,024 | B1 | * | 12/2003 | Andre ......................... 375/295 |

FOREIGN PATENT DOCUMENTS

WO    9845942 A2    10/1998

OTHER PUBLICATIONS

"A Fully Integrated 900MHz CMOS Double Quadrature Downconverter", by J. Crols et al., IEEE International Solid-State Circuits Conference, pp. 136-137.
"Single Sideband Modulation using Sequence Asymmetric Polyphase Networks", by M.J. Gingell, Electrical Communication, vol. 48, No. 1 and 2, 1973, pp. 21-25.
"Realization of a Constant Phase Difference", by S. Darlington, pp. 94-104.
"Synthesis of Wideband Two-Phase Networks", by H.J. Orchard, Wireless Engineer, Mar. 1950, pp. 72-80.
"The Design of Wide-Band Phase Splitting Networks", by W. Saraga, Proceedings of the IRE, Jul. 1950, pp. 754-770.
"Design of RC Wide-Band 90-Degree Phase-Difference Network", by D.K. Weaver, pp. 671-676, 1954.

* cited by examiner

*Primary Examiner*—Khanh Tran (57) ABSTRACT

A method and device are described for generating two output signals (I; Q) each substantially identical to a square-wave input signal (A) from a local oscillator (2), wherein the first output signal (I) may have a certain time shift with respect to the input signal (A), and wherein the second output signal (Q) is shifted over $T_1/4$ [mod $T_1$] with respect to the first output signal (I), $T_1$ being the period of the input signal (A). To generate the first output signal (I), Fourier components ($S_1(\omega_1)$, $S_3(\omega_3)$, $S_5(\omega_5)$, $S_7(\omega_7)$, $S_9(\omega_9)$, $S_{11}(\omega_{11})$ etc) of the input signal are combined. To generate the second output signal (Q), Fourier components ($S_1(\omega_1)$, $S_5(\omega_5)$, $S_9(\omega_9)$ etc) of the input signal are phase shifted over +90° while Fourier components ($S_3(\omega_3)$, $S_7(\omega_7)$, $S_{11}(\omega_{11})$ etc) of the input signal are phase shifted over −90°, and the thus shifted Fourier components of the input signal are combined.

17 Claims, 6 Drawing Sheets

GENERATING TWO SIGNALS HAVING A MUTUAL PHASE DIFFERENCE OF 90°

In many fields, there is a general desire to be able to generate two signals with a mutual 90° phase difference, both substantially identical to one input signal. Examples of fields where such signal combination is desirable are for instance: television tuners, mobile telephones (GSM, NMT), wireless telephones (DECT), etc. As is commonly known, quadrature signals are used in, for instance, television tuners for, inter alia, mirror rejection.

For generating such signal combination as mentioned above, several techniques are already available. Each of those available techniques suffers from some disadvantages. One example of such known technique is to use frequency division with gate circuits, flip flops, etc. A disadvantage of this known technique is that the frequency of the input signal must be chosen at least twice as high as the desired frequency of the 0° and 90° signals. Another technique is to use a separate oscillator which generates two output signals having 90° phase difference, the oscillator being coupled to the original input signal by means of a phase locked loop. A disadvantage of this technique is that it involves a relatively large amount of electronic circuitry and a relatively large amount of energy dissipation.

A further technique that is known per se is to use a phase-shifting network. Phase-shifting networks generate one output signal identical to the input signal, with a fixed phase delay that can be set to 90°. However, a disadvantage of phase-shifting networks to date is that they require the input signal to be sine-shaped. More particularly, phase-shifting networks to date are not capable of generating two output signals having a mutual 90° phase difference and both at least substantially identical to an input signal having a square wave shape, although most local oscillators in the above-mentioned examples generate a square wave signal.

The present invention aims to provide an approach which allows the use of a phase-shifting network to generate two output signals having a mutual 90° phase difference, without the restriction that the input signal needs to be sine-shaped. To this end, the invention provides a method and device for generating two signals having a mutual phase difference of 90° as defined in the independent claims. The dependent claims define advantageous embodiments. In a preferred embodiment, the present invention provides a phase-shifting network capable of receiving a square wave signal and of outputting two square wave signals having a mutual 90° phase difference and both at least substantially identical to the input signal.

The invention is based on the insight that a square wave signal such as generated by a local oscillator can be approximated as a Fourier series of a fundamental wave and a limited number of odd harmonic waves, each of said waves being sine-shaped. In practice, the number of odd harmonic waves that need to be taken into account depends on the frequency of the fundamental wave: the higher the frequency of the fundamental wave, the lower the number of odd harmonic waves that play a significant role.

Therefore, based on this insight, the present invention proposes a phase-shifting network which operates on the fundamental Fourier component and at least the third harmonic Fourier component, and preferably also the fifth harmonic Fourier component, of an input signal in such a way that these components are shifted over the same amount of time equal to one fourth of the period of the fundamental Fourier component.

In a preferred embodiment, the phase-shifting network of the invention comprises a passive polyphase filter. Such filter has an intrinsic property of shifting all frequency components within a pass band over the same angle. Assuming that the desired shift angle is equal to 90°, said intrinsic property would be correct for the fifth harmonic Fourier component but would be wrong for the third harmonic Fourier component, which should be shifted over 270°, which is equivalent to a shift over −90°. The invention is based on the further insight that this is equivalent to a +90° shift of the third harmonic Fourier component with negative frequency. Therefore, according to the invention in this preferred embodiment, the phase-shifting network has a frequency characteristic that passes the third harmonic Fourier component with negative frequency and suppresses the third harmonic Fourier component with positive frequency.

These and other aspects, characteristics and advantages of the present invention will be further clarified by the following description of exemplary embodiments of a network in accordance with the invention.

In the drawings, in which same reference numerals indicate equal or similar parts, FIG. 1 schematically shows a polyphase filter.

Figure 1:
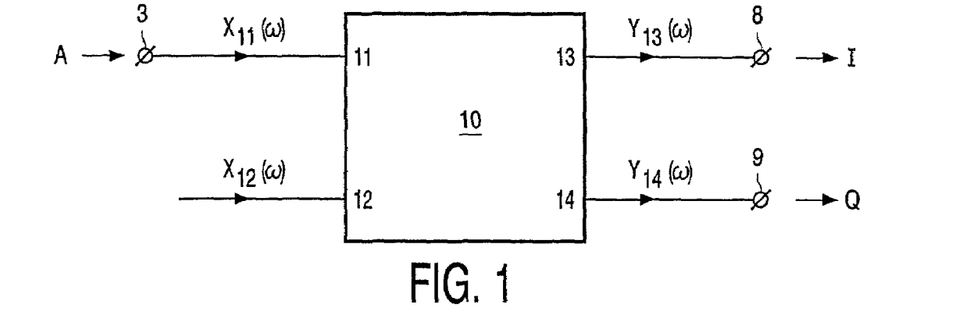

FIG. 1 schematically shows a polyphase filter 10 having a first input 11, a second input 12, a first output 13 and a second output 14. More particularly, this polyphase filter 10 is a two-phase filter. Polyphase filters are known per se. For instance, reference is made to the article "A Fully Integrated 900 MHz CMOS Double Quadrature Downconvertor" by J. Crols et al. in 1995 ISSCC Digest of Technical Papers, Vol.38, IEEE press, 1995, p. 136–137. Therefore, an elaborate explanation of the design and operation of the polyphase filter 10 is not necessary here. However, in order to introduce some symbols and expressions, some aspects of the operation of the polyphase filter 10 (two-phase filter) are described here.

Assume that two input signals $X_{11}(\omega)$ and $X_{12}(\omega)$ are applied to the two inputs 11 and 12, respectively, the two input signals $X_{11}(\omega)$ and $X_{12}(\omega)$ being sine-shaped and having the same frequency $\omega$, but having a phase difference of 90°. This can be written as $|\phi_{11}-\phi_{12}|=90°$ [mod 360°], wherein $\phi_{11}$ is the phase of the first input signal $X_{11}(\omega)$ applied to the first input 11, while $\phi_{12}$ is the phase of the second input signal $X_{12}(\omega)$ applied to the second input 12. Two situations can be distinguished:

1) $X_{11}(\omega)$ is leading, i.e. $\phi_{11}-\phi_{12}=+90°$
2) $X_{12}(\omega)$ is leading, i.e. $\phi_{11}-\phi_{12}=-90°$ A sine-shaped signal may be represented in complex notation as $X(\omega)=X \cdot e^{j\omega t}$, keeping in mind that the actual physical signal is the real part of the complex expression. Then, both the above-mentioned cases of $\phi_{11}-\phi_{12}=+90°$ and $\phi_{11}-\phi_{12}=-90°$ can be written as $$X_{11}(\omega)=X \cdot e^{j\omega t} \text{ and } X_{12}(\omega)=jX \cdot e^{j\omega t}$$

Using $X=|X|\cdot e^{j\phi}$ yields:

$$Re(X_{11})=|X|\cos(\omega t+\phi) \text{ and } Re(X_{12})=|X|\cos(\omega t+\phi+\pi/2)$$

so that $\omega<0$ corresponds to the case of $\phi_{11}-\phi_{12}=+90°$, whereas $\omega>0$ corresponds of $\phi_{11}-\phi_{12}=-90°$.

At its outputs 13 and 14, the polyphase filter 10 generates sine-shaped output signals $Y_{13}(\omega)$ and $Y_{14}(\omega)$, respectively, having the same frequency $\omega$ as the two input signals $X_{11}(\omega)$ and $X_{12}(\omega)$.

It is further assumed that the polyphase filter 10 has a transfer characteristic $H(\omega)$ that can be described as $$H(\omega)=Y_{13}/X_{11}=Y_{14}/X_{12} \quad (1)$$

in the case that $X_{12}(\omega)=jX_{11}(\omega)$.

If the (normalized) transfer characteristic $H(\omega)$ of the polyphase filter 10 is such that, for a certain positive frequency $\omega_x$, the following equation (2) is valid:

$$H(\omega_x)=1 \text{ and } H(-\omega_x)=0 \quad (2)$$

then the polyphase filter 10 can be used for generating two output signals $Y_{13}$ and $Y_{14}=jY_{13}$ on the basis of only one input signal $X_{11}$, as will be explained with reference to FIGS. 2A–C.

Figure 2A:
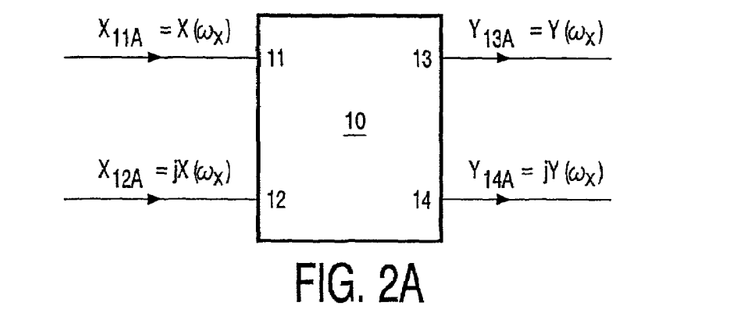
FIGS. 2A–C illustrate how a polyphase filter can be used to generate a two-phase output signal with positive frequency on the basis of a one-phase input signal.

In FIG. 2A, a first input signal $X_{11A}=X(\omega_x)$ is applied to the first input 11, and a second input signal $X_{12A}=jX_{11A}=jX(\omega_x)$ is applied to the second input 12. It follows from the above equations (1) and (2) that the polyphase filter 10 then generates a first output signal $Y_{13A}=Y(\omega_x)$ and a second input signal $Y_{14A}=jY_{13A}=jY(\omega_x)$ at its two outputs 13 and 14, respectively.

Figure 2B:
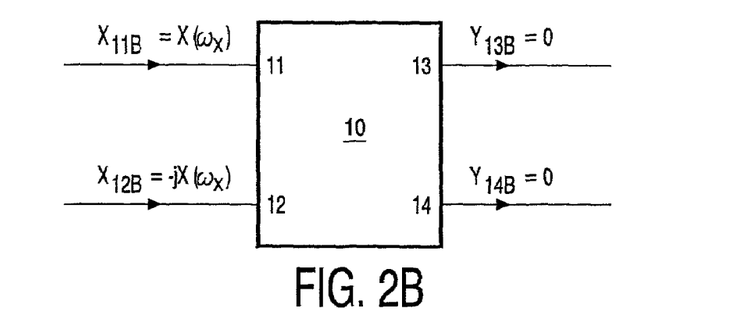
Figure 2C:
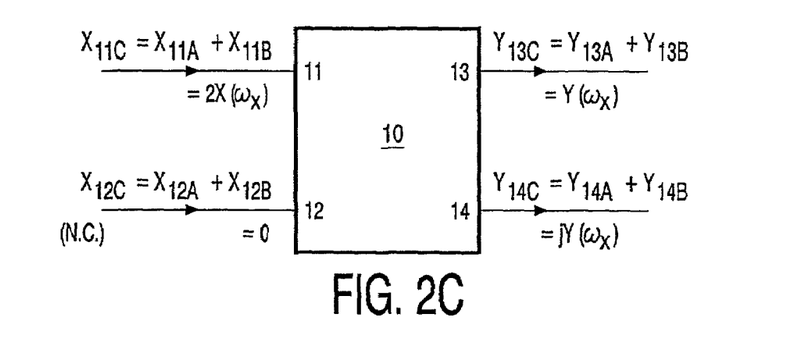

In FIG. 2B, a first input signal $X_{11B}=X(\omega_x)$ is applied to the first input 11 and a second input signal $X_{12B}=-jX_{11B}=-jX(\omega_x)$ is applied to the second input 12. It follows from the above equations (1) and (2) that the polyphase filter 10 then generates zero output signals $Y_{13B}=0$ and $Y_{14B}=0$ at its two outputs 13 and 14, respectively.

The polyphase filter 10 is a linear filter, which means that, if two input signals are added, the corresponding output signals are also added. In FIG. 2C, the two input signals used in FIG. 2A and in FIG. 2B, respectively, are added.

In other words, the first input 11 receives $$X_{11C}=X_{11A}+X_{11B}=2X(\omega_x),$$

while the second input 12 (not connected) receives $$X_{12C}=X_{12A}+X_{12B}=jX(\omega_x)+(-jX(\omega_x))=0.$$

Then, also the two output signals of FIG. 2A and FIG. 2B are added; therefore, the polyphase filter 10 then generates a first output signal $Y_{13C}=Y(\omega_x)$ and a second output signal $Y_{14C}=jY(\omega_x)$ at its two outputs 13 and 14, respectively.

In other words, if the first input 11 receives a real input signal $X(\omega_x)$ while the second input 12 is zero, the polyphase filter 10 then generates first and second output signals $Y_{13}(\omega_x)=\frac{1}{2}\cdot X(\omega_x)$ and $Y_{14}(\omega_x)=\frac{1}{2}\cdot jX(\omega_x)$. These are two real output signals with 90° phase difference, also indicated as a sine-shaped two-phase output signal having positive frequency. In the above, any possible phase difference between $Y_{13}(\omega_x)$ and $X(\omega_x)$ is neglected.

It is noted that the above explanation would also apply in case the sign of $Y_{14A}$ would be reversed. In that case, the two-phase output signal may be indicated as having negative frequency. However, it is also possible to consider output 14 as the "first" output and to consider output 13 as the "second" output.

Thus, using a polyphase filter, it is possible to generate two signals $Y_{13}(\omega_x)$ and $Y_{14}(\omega_x)$ with 90° phase difference with respect to each other, on the basis of one input signal $X(\omega_x)$.

In the above, two assumptions have been made. One assumption is that the input signal $X(\omega_x)$ is sine-shaped. The second assumption is that the frequency $\omega_x$ of the input signal $X(\omega_x)$ lies in a frequency region where equation (2) is valid. Such frequency region will hereinafter also be indicated as opposite sign rejecting pass region, abbreviated as OSR pass region, indicating that frequencies within the region are passed whereas identical frequencies with opposite sign are rejected or at least suppressed.

To date, broadband polyphase filters exist where the OSR pass region ranges from 0 to very high frequencies, approximating infinity, at least for all practical purposes. Also, polyphase filters have been designed for cooperation with a specific local oscillator operating in a specific frequency band with central frequency $\omega_{LO}$ and bandwidth $BW_{LO}$; those polyphase filters have an OSR band-pass region coinciding with the operational frequency band of the local oscillator, the transfer function $H(\omega)$ being zero for all other frequencies.

With such prior art polyphase filters it is, however, not possible to employ the same simple approach in generating two signals with 90° phase difference with respect to each other, on the basis of one input signal, if the input signal is a binary signal and the output signals are required to be binary signals, too. More specifically, in many applications, the local oscillator generates a square wave signal with 50% duty cycle; the technique described in the above can not be used in such cases. This will be explained in the following.

Figure 3A:
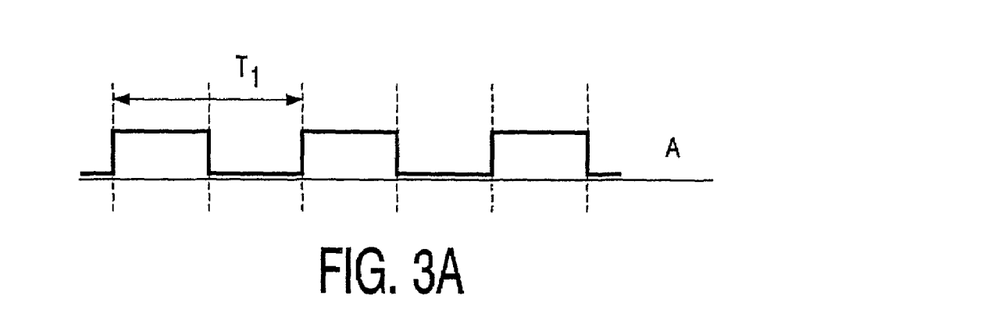
FIGS. 3A–C illustrate the shifting of Fourier components.
Figure 3B:
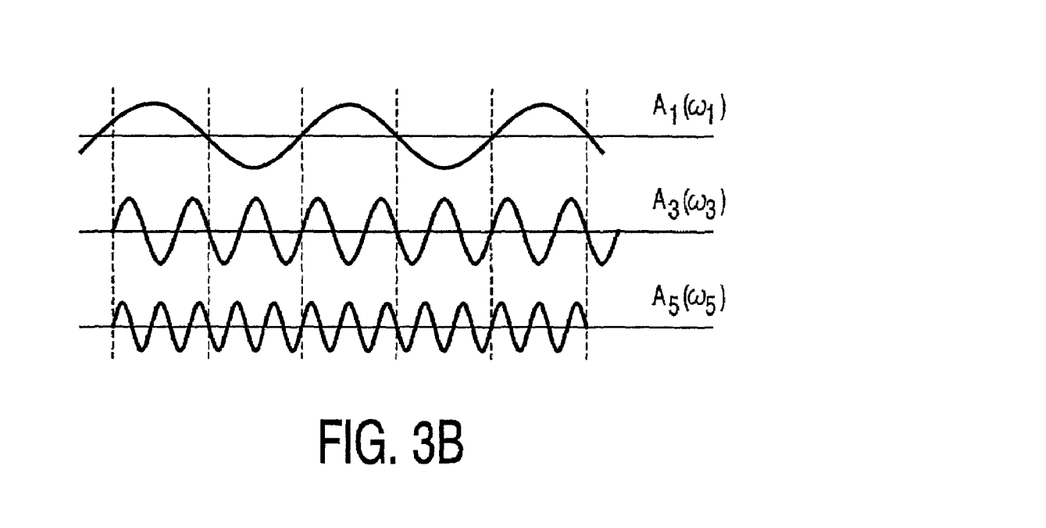

Assume that the local oscillator generates an output signal A being a square wave signal with 50% duty cycle, having a period $T_1$, as illustrated in FIG. 3A. As is well known, such square wave signal A can be developed into sine-shaped signal components (Fourier series). These sine-shaped signal components comprise a fundamental wave with the fundamental frequency $\omega_1=1/T_1$, which will be indicated as $A_1(\omega_1)$, as illustrated in FIG. 3B. The Fourier series further comprises odd harmonic waves $A_3(\omega_3)$, $A_5(\omega_5)$, ..., $A_{2n+1}(\omega_{2n+1})$, wherein n=1, 2, 3 .... Herein, the frequency component $A_{2n+1}(\omega_{2n+1})$ is the (2n+1)-th harmonic wave with respect to the fundamental wave $A_1$, having a frequency $\omega_{2n+1}$ being equal to (2n+1) times the fundamental frequency $\omega_1$. FIG. 3B also shows a part of the 3rd and 5th harmonic waves.

It is noted that, although in general the Fourier series is an infinite series having an infinite number of frequency components, in most practical circumstances the output signal A from the local oscillator can be approximated very well by a limited number of Fourier terms, for instance five.

If a polyphase filter would be used to generate quadrature signals on the basis of such square wave local oscillator signal A, the polyphase filter will operate on each of said sine-shaped Fourier components in the way described above. Thus, if the polyphase filter would have a relatively narrow OSR band pass characteristic, only accommodating the fundamental frequency $\omega_1$ of the local oscillator, the polyphase filter will only generate two sine-shaped output signals $Y_{13}(\omega_1)$ and $Y_{14}(\omega_1)$ with a mutual phase difference of 90°. Although it is possible to construct square wave signals on the basis of such sine-shaped output signals, for instance by using an amplifier with large gain so that the signals will clip, this will necessitate further circuitry, while further small deviations in the sine-shaped output signals may lead to important timing deviations in the constructed square wave signal. In order to improve the accuracy in the zero-crossings, more Fourier terms should be taken into account.

Figure 3C:
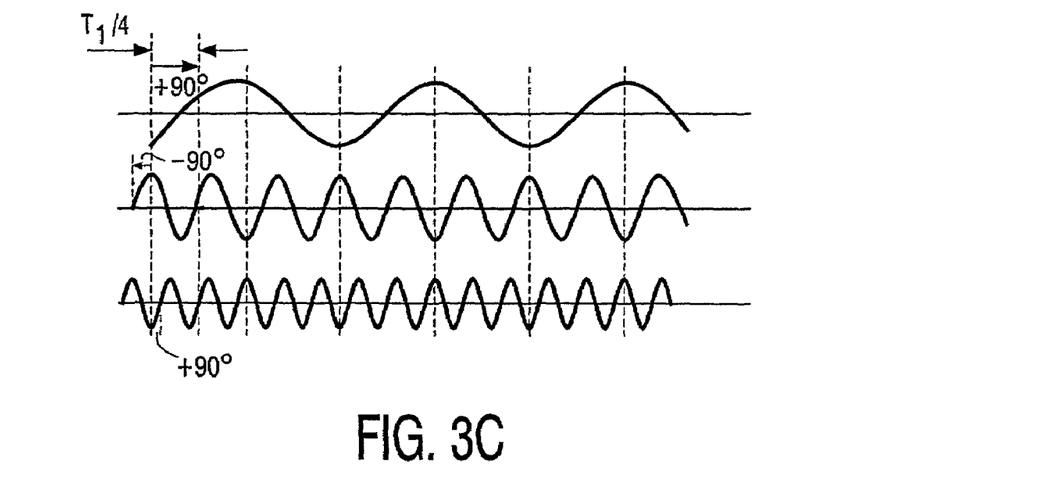

If, on the other hand, the polyphase filter would have a relatively wide OSR pass characteristic, also accommodating the harmonic frequencies $\omega_3$, $\omega_5$, $\omega_7$, etc, the polyphase filter would not generate the 90° output signal in a correct way, as will be explained hereinafter with reference to FIG. 3C.

First, it is pointed out that the required 90° phase difference between the two output signals $Y_{13}$ and $Y_{14}$ relates to the fundamental frequency $\omega_1$. Thus, in fact, it is required that the two output signals $Y_{13}$ and $Y_{14}$ are identical, yet shifted in time over a time distance $T_1/4$ [mod $T_1$] with respect to each other.

Second, it is pointed out that, in order to meet the objective that the second output signal $Y_{14}$ is equal to the first output signal $Y_{13}$ yet shifted over $T_1/4$ [mod $T_1$], it will be necessary that, when creating the second output signal $Y_{14}$, each frequency component $A_{2n+1}(\omega_{2n+1})$ of the input signal A is shifted over a time distance $T_1/4$ [mod $T_1$]. However, as mentioned above, the polyphase filter 10 has the intrinsic property of shifting all frequency components $A_{2n+1}(\omega_{2n+1})$ within its pass band over a phase angle of 90°, this phase shift of 90° being always measured with respect to the corresponding frequency $\omega_{2n+1}$ of the signal component in question. Such a phase shift does not correspond to the required time shift for all frequency components.

For instance, for the fundamental wave $A_1$ and the fifth harmonic $A_5$, the ninth harmonic $A_9$, etc., a time shift of $T_1/4$ corresponds respectively to a phase shift of 90°, 450°, 810°, etc., which is all equivalent to a respective phase shift of +90° [mod 360°]; in other words: these are "matching" shifts.

However, for the third [seventh] {eleventh} harmonic wave $A_3$ [$A_7$] {$A_{11}$}, etc., the required time shift of $T_1/4$ corresponds to a required phase shift of 270° [630°] {990°}, respectively, in each case being equivalent to a required phase shift of −90° [mod 360°]. As mentioned earlier, the conventional polyphase filter can not deliver such phase shift. In fact, if a conventional polyphase filter would have a relatively wide OSR pass characteristic, also accommodating the harmonic frequencies $\omega_3$, $\omega_7$, $\omega_{11}$, etc, these harmonic waves are likewise shifted over +90°, i.e. 180° wrong.

According to an important aspect of the present invention, this problem is overcome if an additional phase shift of 180° is exerted on the third [seventh] {eleventh} harmonic wave $A_3$ [$A_7$] {$A_{11}$}, etc. This can, for instance, be done by individually selecting the separate harmonic waves, for instance by means of appropriate band pass filters, then individually processing each harmonic wave such that for each individual harmonic wave a +90° or a −90° [mod 360°] shift, as required, is obtained, and then combining the shifted harmonic waves.

Figure 4:
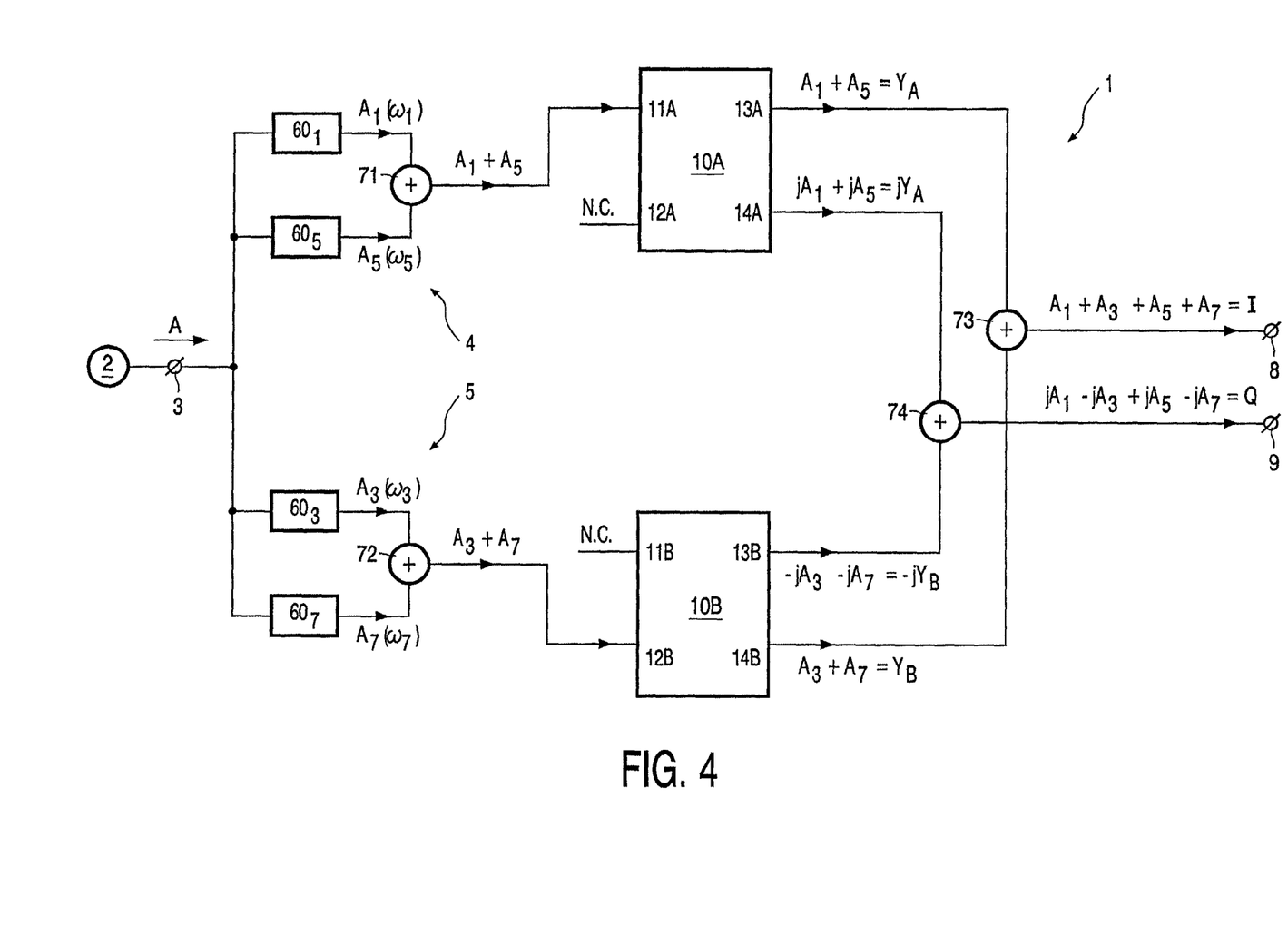
FIG. 4 is a block diagram schematically illustrating an embodiment of a device according to the invention.

FIG. 4 shows an embodiment where the harmonic waves that need to be shifted over +90° are combined, and one single broadband polyphase filter 10A is used to perform the +90° shift for all those harmonic waves in common, whereas the harmonic waves that need to be shifted over −90° are also combined, and one single broadband polyphase filter 10B is used to perform the −90° shift for all those harmonic waves in common. FIG. 4 shows a circuit 1 having an input 3 for receiving an output signal A from a local oscillator 2, and two outputs 8 and 9 for generating an in-phase output signal I and a quadrature output signal Q, both being identical to the input signal A. As described above, the local oscillator signal A is a square wave signal with 50% duty cycle, having a period $T_1$. As mentioned above, the local oscillator signal A can be developed into sine-shaped signal components $A_1(\omega_1)$, $A_3(\omega_3)$, $A_5(\omega_5)$, . . . , $A_{2n+1}(\omega_{2n+1})$, wherein n=0, 1, 2, 3 . . . The circuit 1 of FIG. 4 is designed to process four Fourier components, and is suitable for a situation where the output signal A from the local oscillator can be approximated by four Fourier components. From the following description, it will be clear to a person skilled in the art how this embodiment is to be supplemented in order to take higher order Fourier components into account.

The circuit 1 comprises a first Fourier component selection section 4, selecting those Fourier components which need to be shifted over +90° in the quadrature output signal Q. These are the Fourier components $A_1(\omega_1)$, $A_5(\omega_5)$, $A_9(\omega_9)$, . . . , $A_{2n+1}(\omega_{2n+1})$, wherein n=0, 2, 4, 6 . . . For each of those Fourier components, the first Fourier component selection section 4 comprises a corresponding band pass filter $60_{2n+1}$. In the present embodiment, the first Fourier component selection section 4 is intended to select the fundamental wave $A_1(\omega_1)$ and the fifth harmonic $A_5(\omega_5)$. Thus, the first Fourier component selection section 4 comprises a first band pass filter $60_1$ having a pass band $61_1$ in the frequency range between $\omega_1-BW_1/2$ and $\omega_1+BW_1/2$, and a second band pass filter $60_5$ having a pass band $61_5$ in the frequency range between $\omega_5-BW_5/2$ and $\omega_5+BW_5/2$.

The input terminals of these band pass filters are connected to the input 3, while the output terminals of these band pass filters are coupled to a first adder 71, the output of which is coupled to the first input 11A of a first polyphase filter 10A. Thus, the first input 11A of this first polyphase filter 10A receives an input signal $X_{11A}=A_1(\omega_1)+A_5(\omega_5)$. The second input 12A of this first polyphase filter 10A receives a zero signal.

Similarly, the circuit 1 comprises further a second Fourier component selection section 5, selecting those Fourier components which need to be shifted over −90° in the quadrature output signal Q. These are the Fourier components $A_3(\omega_3)$, $A_7(\omega_7)$, $A_{11}(\omega_{11})$, . . . , $A_{2n+1}(\omega_{2n+1})$, wherein n=1, 3, 5 . . . For each of those Fourier components, the second Fourier component selection section 5 comprises corresponding band pass filters $60_{2n+1}$. In the present embodiment, the second Fourier component selection section 5 is intended to select the third harmonic $A_3(\omega_3)$ and the seventh harmonic $A_7(\omega_7)$. Thus, the second Fourier component selection section 5 comprises a third band pass filter $60_3$ having a pass band $61_3$ in the frequency range between $\omega_3-BW_3/2$ and $\omega_3+BW_3/2$, and a fourth band pass filter $60_7$ having a pass band $61_7$ in the frequency range between $\omega_7-BW_7/2$ and $\omega_7+BW_7/2$.

The input terminals of these band pass filters are connected to the input 3, while the output terminals of these band pass filters are coupled to a second adder 72, the output of which is coupled to the second input 12B of a second polyphase filter 10B. Thus, the second input 12B of this second polyphase filter 10B receives an input signal $X_{12B}=A_3(\omega_3)+A_7(\omega_7)$. The first input 11B of this second polyphase filter 10B receives a zero signal.

The two polyphase filters 10A and 10B are broadband polyphase filters having, at least for realistic frequencies, (normalized) transfer characteristics $H(\omega)$ in accordance with the following equation (3):

$$H(\omega)=1 \text{ for } \omega \geq 0 \text{ and } H(\omega)=0 \text{ for } \omega<0 \qquad (3)$$

In fact, the two polyphase filters 10A and 10B may be identical.

As will be clear from the above explanation of the operation of the polyphase filters, the first polyphase filter 10A provides at its first output 13A a first output signal $Y_{13A}$ according to $2Y_{13A}=X_{11A}=A_1(\omega_1)+A_5(\omega_5)$, and at its second output 14A a second output signal $Y_{14A}$ according to $Y_{14A}=jY_{13A}$. It may be that the first output signal $Y_A$ has a certain time delay $\Delta T_A$ with respect to the input signal $X_{11A}$.

Further, as will also be clear from the above explanation of the operation of the polyphase filters, the second polyphase filter 10B provides at its second output 14B a third output signal $Y_{14B}$ according to $2Y_{14B}=X_{12B}=A_3(\omega_3)+A_7(\omega_7)$, and at its first output 13B a fourth output signal $Y_{13B}$ according to $Y_{13B}=-jY_{14B}=-jX_{12B}$. It may be that the third output signal $Y_{14B}$ has a certain time delay $\Delta T_B$ with respect to the input signal $X_{12B}$; the two polyphase filters 10A and 10B should be matched such that said two time delays $\Delta T_A$ and $\Delta T_B$ are equal.

The first output 13A of the first polyphase filter 10A and the second output 14B of the second polyphase filter 10B are coupled to a third adder 73, the output of which is coupled to the first output terminal 8 of the circuit 1 to provide the first output signal $$I=Y_{13A}+Y_{14B}=(A_1(\omega_1)+A_3(\omega_3)+A_5(\omega_5)+A_7(\omega_7))/2$$

Similarly, the second output 14A of the first polyphase filter 10A and the first output 13B of the second polyphase filter 10B are coupled to a fourth adder 74, the output of which is coupled to the second output terminal 9 of the circuit 1 to provide the second output signal $$Q=Y_{14A}+Y_{13B}=j(A_1(\omega_1)-A_3(\omega_3)+A_5(\omega_5)-A_7(\omega_7))/2$$

The circuit proposed in FIG. 4 functions satisfactorily. However, it needs two polyphase filters. Preferably, the step of shifting the subsequent harmonic waves over alternatively +90° and −90° is performed by one single polyphase filter that receives all harmonic waves at one input.

According to the present invention, such a design is possible because an additional phase shift of 180° is equivalent to using a Fourier component with negative frequency $-\omega_3$, $-\omega_7$, $-\omega_{11}$, etc. in the polyphase filter, as will be explained with reference to FIGS. 5A–5C.

Assume that, for a certain positive frequency $\omega_x$, the transfer characteristic $H(\omega)$ of the polyphase filter 10 obeys the following equation (4):

$$H(\omega_x)=0 \text{ and } H(-\omega_x)=1 \quad (4)$$

Figure 5A:
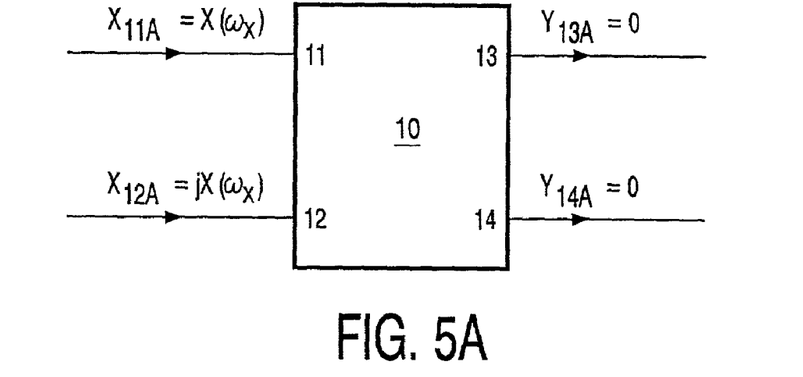
FIGS. 5A–C illustrate how a polyphase filter can be used to generate a two-phase output signal with negative frequency on the basis of a one-phase input signal.

In FIG. 5A, a first input signal $X_{11A}=X(\omega_x)$ is applied to the first input 11, and a second input signal $X_{12A}=jX_{11A}=jX(\omega_x)$ is applied to the second input 12. It follows from the above equations (1) and (4) that the polyphase filter 10 then generates zero output signals $Y_{13}(\omega_x)=0$ and $Y_{14}(\omega_x)=0$ at its two outputs 13 and 14, respectively.

Figure 5B:
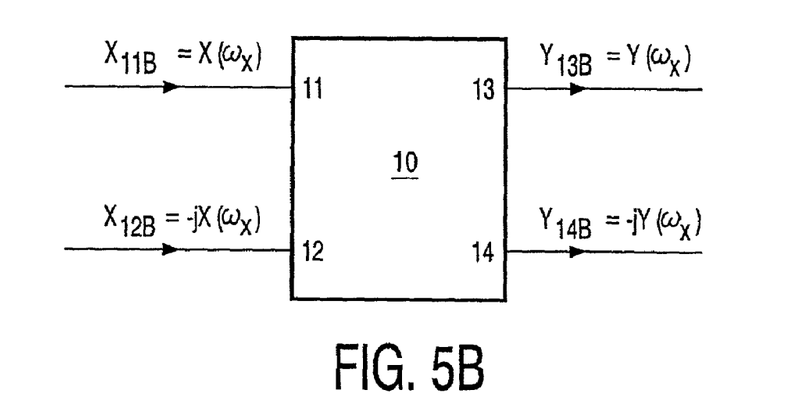

In FIG. 5B, a first input signal $X_{11B}=X(\omega_x)$ is applied to the first input 11 and a second input signal $X_{12B}=-jX_{11B}=-jX(\omega_x)$ is applied to the second input 12. It follows from the above equations (1) and (4) that the polyphase filter 10 then generates a first output signal $Y_{13B}=Y(\omega_x)$ and a second output signal $Y_{14B}=-jY_{13B}=-jY(\omega_x)$ at its two outputs 13 and 14, respectively.

Figure 5C:
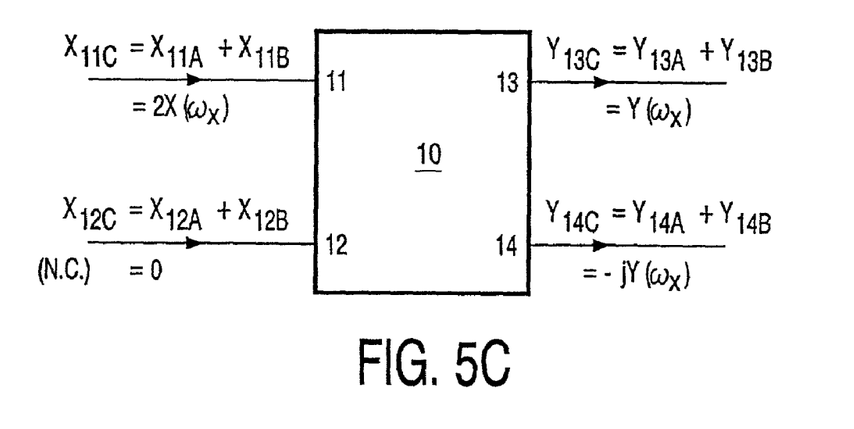

In FIG. 5C, the two input signals used in FIG. 5A and in FIG. 5B, respectively, are added. In other words, the first input 11 receives $X_{11C}=X_{11A}+X_{11B}=2X(\omega_x)$, while the second input 12 receives $X_{12C}=X_{12A}+X_{12B}=jX(\omega_x)+(-jX(\omega_x))=0$. Then, also the two output signals of FIG. 5A and FIG. 5B are added; therefore, the polyphase filter 10 then generates a first output signal $Y_{13C}=jY(\omega_x)$ and a second output signal $Y_{14C}=-jY_{13C}=-jY(\omega_x)$ at its two outputs 13 and 14, respectively.

In other words, for such frequencies $\omega_x$ for which equation (4) applies, if the first input 11 receives a real input signal $X(\omega_x)$ while the second input 12 is zero, then the polyphase filter 10 generates first and second output signals $Y_{13}(\omega_x)=\frac{1}{2}\cdot X(\omega_x)$ and $Y_{14}(\omega_x)=-\frac{1}{2}\cdot jX(\omega_x)=-jY_{13}(\omega_x)$. These are two real output signals with −90° phase difference, also indicated as a sine-shaped two-phase output signal having negative frequency.

Figure 6:
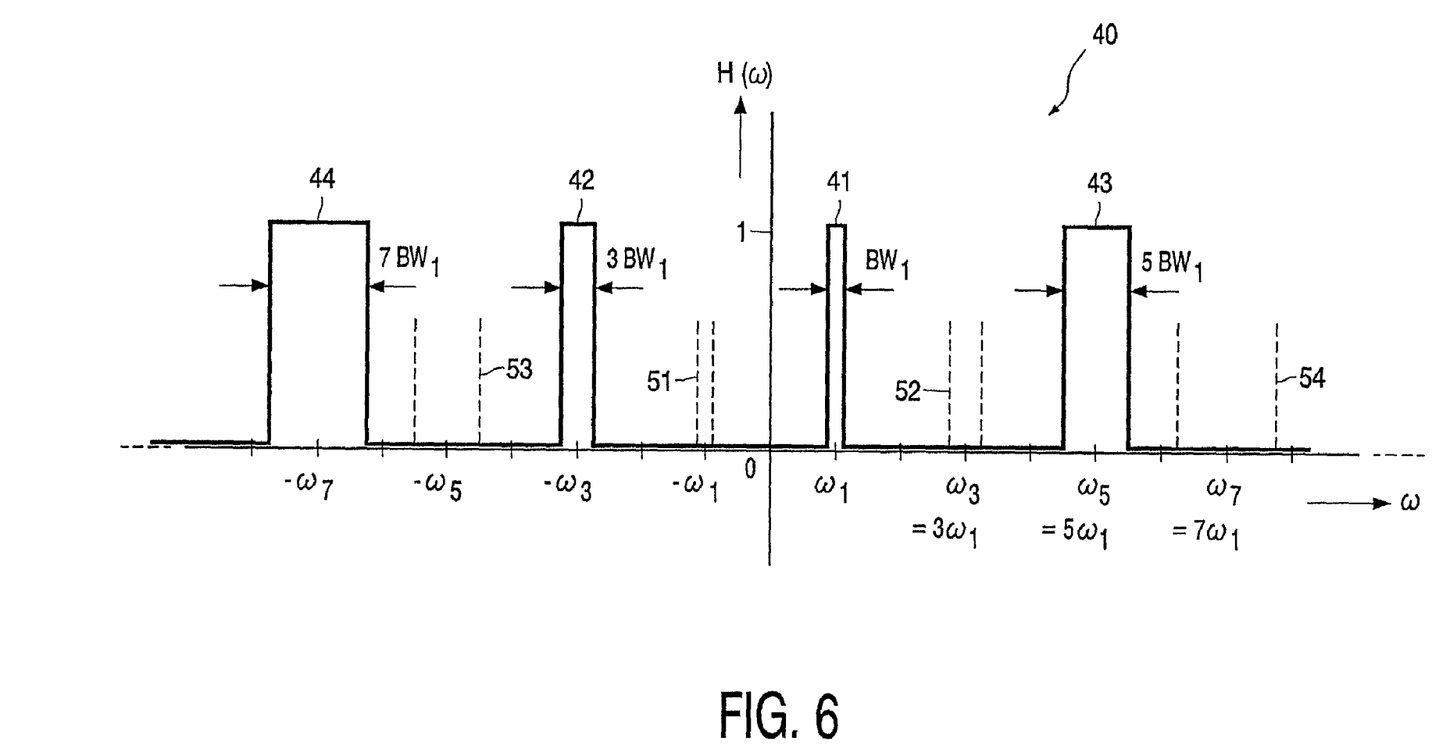
FIG. 6 shows the frequency characteristic of a polyphase filter according to the present invention.

Based on this insight, the present invention proposes a polyphase filter 10 with a novel frequency characteristic 40 as shown in FIG. 6, adapted for use with a local oscillator having a central oscillator frequency $\omega_{LO}$ and a bandwidth $BW_{LO}$. This frequency characteristic 40 has a first OSR band pass region 41 with a positive central frequency $\omega_1=\omega_{LO}$ and a bandwidth $BW_1$ substantially equal to the bandwidth $BW_{LO}$ of the local oscillator. More specifically, it is indicated in FIG. 6 that $H(\omega)=0$ in the rejection range 51 between $-\omega_1-BW_1/2$ and $-\omega_1+BW_1/2$, i.e. frequencies around $-\omega_1$ are effectively suppressed. The frequency characteristic 40 further has a second OSR band pass region 42 with a negative central frequency $\omega_{42}=-3\omega_1$ and a bandwidth $BW_{42}$ substantially equal to 3 times the bandwidth $BW_1$ of the first OSR band pass region 41. More specifically, it is indicated in FIG. 6 that $H(\omega)=0$ in the rejection range 52 between $3\omega_1-3BW_1/2$ and $3\omega_1+3BW_1/2$, i.e. frequencies around $+3\omega_1$ are effectively suppressed. In view of this second OSR band pass region 42 (and the corresponding rejection region 52), the polyphase filter 10 can correctly process the third harmonic wave $A_3(\omega_3)$.

Preferably, the polyphase filter 10 is also designed for correctly processing the fifth harmonic wave $A_5(\omega_5)$. To that end, the frequency characteristic 40 further has a third OSR band pass region 43 with a positive central frequency $\omega_{43}=+5\omega_1$ and a bandwidth $BW_{43}$ substantially equal to 5 times the bandwidth $BW_1$ of the first OSR band pass region 41. More specifically, it is indicated in FIG. 6 that $H(\omega)=0$ in the rejection range 53 between $-5\omega_1-5BW_1/2$ and $-5\omega_1+5BW_1/2$, i.e. frequencies around $-5\omega_1$ are effectively suppressed. Preferably, the polyphase filter 10 is also designed for correctly processing the seventh harmonic wave $A_7(\omega_7)$. To that end, the frequency characteristic 40 further has a fourth OSR band pass region 44 with a negative central frequency $\omega_{44}=-7\omega_1$ and a bandwidth $BW_{44}$ substantially equal to 7 times the bandwidth $BW_1$ of the first OSR band pass region 41. More specifically, it is indicated in FIG. 6 that $H(\omega)=0$ in the rejection range 54 between $+7\omega_1-7BW_1/2$ and $+7\omega_1+7BW_1/2$, i.e. frequencies around $+7\omega_1$ are effectively suppressed.

In general terms, the polyphase filter 10 has N OSR band pass regions, each having a central frequency according to $\omega_n=(-1)^{(n+1)}\cdot(2n-1)\cdot\omega_1$ for n=1, 2, 3, 4, . . . N, and a bandwidth $BW_n$ substantially equal to $(2n-1)$ times the bandwidth $BW_1$ of the first OSR band pass region 41.

In practice, it may be sufficient if N=2, although preferably N is at least equal to 3. More preferably, $N\geq 5$.

It is observed that, for optimal operational quality, N should be as large as possible. However, in view of the fact that the bandwidth of the successive band pass regions increases, N can not be chosen infinitively high; the limit of the possibilities is reached if neighboring band pass and rejection regions touch, which will be the case if $N=\omega_1/BW_1+1$.

Figure 7:
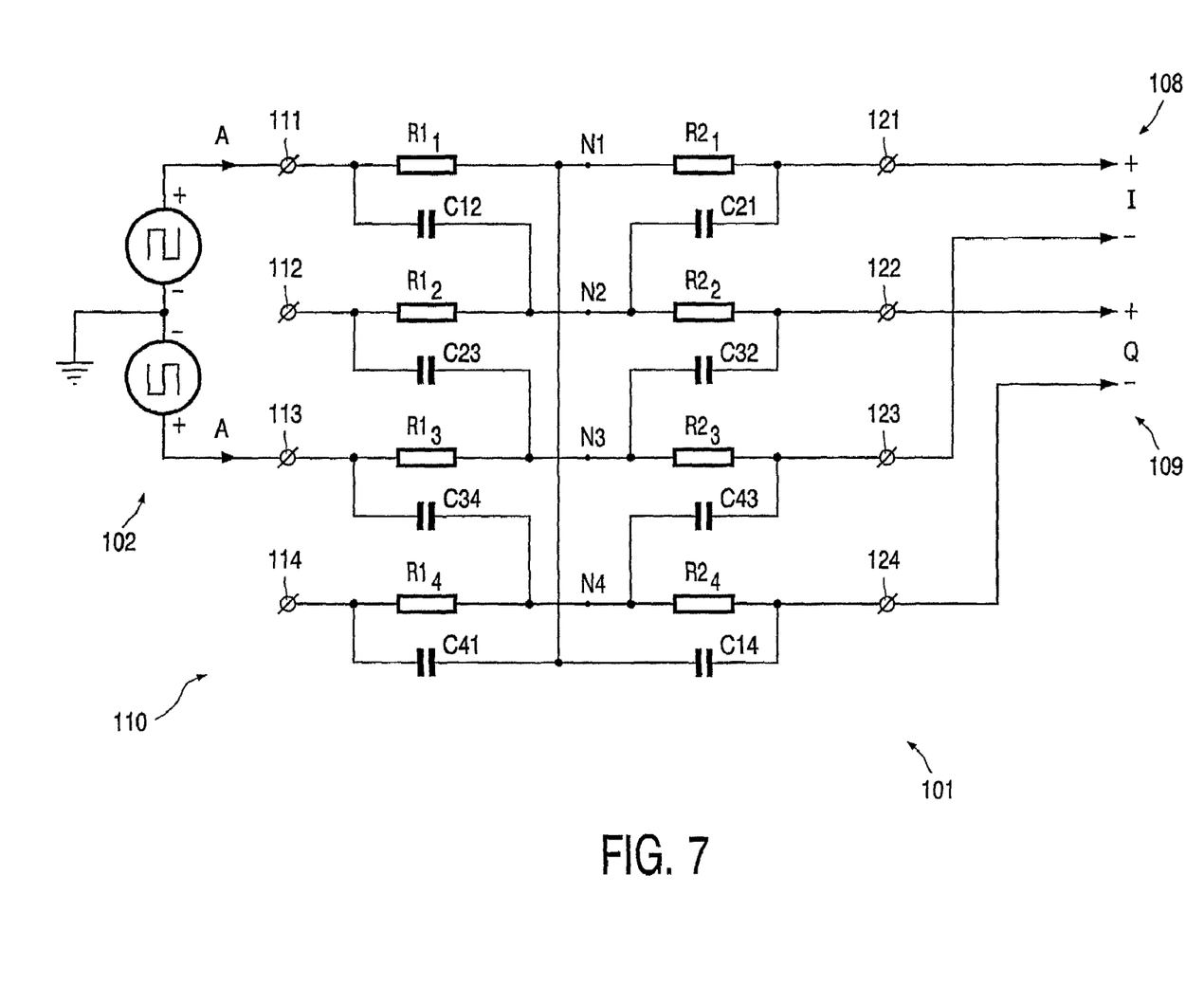
FIG. 7 schematically illustrates a simple embodiment of a polyphase filter according to the present invention.

FIG. 7 shows a relatively simple embodiment of a polyphase filter 110 having the frequency characteristic 40 as described above, wherein N=2, i.e. the polyphase filter 110 of FIG. 7 operates on a fundamental wave and a third harmonic wave. The polyphase filter 110 has four input terminals 111, 112, 113, 114, and four corresponding output terminals 121, 122, 123, 124. The first (second) [third] {fourth} output terminal 121 (122) [123] {124} is connected to the first (second) [third] {fourth} input terminal 111 (112) [113] {114} through a first (second) [third] {fourth} transfer channel comprising a series connection of a first resistor $R1_1$ ($R1_2$) [$R1_3$] {$R1_4$} and a second resistor $R2_1$ ($R2_2$) [$R2_3$] {$R2_4$}, all first resistors $R1_i$ being substantially equal to each other, and all second resistors $R2_i$ being substantially equal to each other.

The first (second) [third] {fourth} node between the first resistor $R1_1$ ($R1_2$) [$R1_3$] {$R1_4$} and the second resistor $R2_1$ ($R2_2$) [$R2_3$] {$R2_4$} of the first (second) [third] {fourth} transfer channel is indicated as N1 (N2) [N3] {N4}.

The first (second) [third] {fourth} input terminal 111 (112) [113] {114} is coupled to the second (third) [fourth] {first} node N2 (N3) [N4] {N1} through a first (second) [third] {fourth} first stage capacitor C12 (C23) [C34] {C41}, while the second (third) [fourth] {first} node N2 (N3) [N4] {N1} is coupled to the first (second) [third] {fourth} output terminal 121(122) [123] {124} through a first (second) [third] {fourth} second stage capacitor C21 (C32) [C43] {C14}.

The first and third input terminals 111 and 113 define a first signal input. In FIG. 7, an input signal A from a local oscillator 102 is received at the first signal input 111, 113 in a balanced way.

The second and fourth input terminals 112 and 114 define a second signal input. In FIG. 7, these terminals are not connected to any signal source or voltage source, i.e. they are floating. Alternatively, they may be connected to zero.

The first and third output terminals 121 and 123 define a first signal output. In FIG. 7, the in-phase output signal I is taken from these two output terminals 121 and 123. The second and fourth output terminals 122 and 124 define a second signal output. In FIG. 7, the quadrature output signal Q is taken from these two output terminals 122 and 124.

The polyphase filter 110 of FIG. 7 may be designed for a fundamental wave of $\omega_1$ equals about 910 MHz, as used in GSM, for instance, with a narrow bandwidth of about 40 MHz, while $\omega_3$ is about 2730 MHz, by selecting the parameter values approximately as follow:

$R1_1$ ($R1_2$) [$R1_3$] {$R1_4$}=22 Ω
$R2_1$ ($R2_2$) [$R2_3$] {$R2_4$}=210.26 Ω
C12 (C23) [C34] {C41}=2.568 pF
C21 (C32) [C43] {C14}=820 pF

It will be clear to a person skilled in the art of designing polyphase filters how these values are to be amended for obtaining different values for $\omega_1$ and $\omega_3$. Further, it will be clear to a person skilled in the art of designing polyphase filters how the circuit of FIG. 7 is to be expanded for processing a fifth harmonic wave, a seventh harmonic wave, etc.

Thus, the present invention succeeds in providing a method and device for generating two output signals I; Q each substantially identical to a square-wave input signal A from a local oscillator 2, wherein the first output signal I may have a certain time shift with respect to the input signal A, and wherein the second output signal Q is shifted over $T_1/4$ [mod $T_1$] with respect to the first output signal I, $T_1$ being the period of the input signal A. To generate the first output signal I, Fourier components $S_1(\omega_1)$, $S_3(\omega_3)$, $S_5(\omega_5)$, $S_7(\omega_7)$, $S_9(\omega_9)$, $S_{11}(\omega_{11})$ etc of the input signal A are combined.

To generate the second output signal Q, Fourier components $S_1(\omega_1)$, $S_5(\omega_5)$, $S_9(\omega_9)$ etc of the input signal A are phase shifted over +90° while Fourier components $S_3(\omega_3)$, $S_7(\omega_7)$, $S_{11}(\omega_{11})$ etc of the input signal A are phase shifted over −90°, and the thus shifted Fourier components of the input signal A are combined.

It should be clear to a person skilled in the art that the scope of the present invention is not limited to the examples discussed in the above, but that several amendments and modifications are possible without departing from the scope of the invention as defined in the appending claims. For instance, in the embodiment of FIG. 4, the second polyphase filter 10B having a broadband normalized transfer characteristic $H(\omega)=1$ for $\omega \geq 0$ and $H(\omega)=0$ for $\omega<0$ can be replaced by a polyphase filter having a broadband normalized transfer characteristic $H(\omega)=1$ for $\omega \leq 0$ and $H(\omega)=0$ for $\omega>0$, in which case the output of the second adder 72 will be fed to the first input 11B, the second input 12B will receive a zero signal, the first output 13B will be coupled to the first combiner 73, and the second output 14B will be coupled to the second combiner 74.

Further, it is also possible that, in order to generate the second output signal Q, Fourier components $S_1(\omega_1)$, $S_5(\omega_5)$, $S_9(\omega_9)$ etc of the input signal A are phase shifted over −90° while Fourier components $S_3(\omega_3)$, $S_7(\omega_7)$, $S_{11}(\omega_{11})$ etc of the input signal A are phase shifted over +90°, and the thus shifted Fourier components of the input signal A are combined.

Further, it is observed that in the above explanation the characteristic 40 of the polyphase filter is described only in relation to the passbands or rejection bands around $\pm\omega_1$, $\pm\omega_3$, $\pm\omega_5$, $\pm\omega_7$, etc, these bands having a bandwidth of $BW_1$, $3BW_1$, $5BW_1$, $7BW_1$, respectively, $BW_1$ being the expected bandwidth of the local oscillator. For frequencies between said bands, the characteristic of the polyphase filter has not been defined. It is noted that, in principle, the characteristic of the polyphase filter outside said bands is not critical. After all, no frequency components are expected in the frequency regions between said bands. Thus, said bands may in fact be wider than mentioned; the indicated bandwidths are to be considered as minimum widths. Further, although in FIG. 6 the characteristic 40 is illustrated as a combination of pass bands 41, 42, 43, 44 with zero transfer function in between, the desired functioning may also be obtained by a characteristic that can be described as a broadband pass characteristic having a certain number of reject regions 51, 52, 53, 54.

In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements, and by means of a suitably programmed computer. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. Method of generating first and second output signals (I, Q) corresponding to an input signal A having a fundamental frequency $\omega_1$, said output signals (I, Q) having a 90° phase difference with respect to each other, the method comprising: providing a predetermined number of first Fourier components $A_{2n+1}(\omega_{2n+1})$, n=0, 2, 4, ..., of the input signal (A), wherein $\omega_{2n+1}=(2n+1)\cdot\omega_1$; exerting a 90° phase shift in a first direction on said first Fourier components; providing a predetermined number of second Fourier components $A_{2n+1}(\omega_{2n+1})$, n=1, 3, 5, ... of the input signal (A); exerting a 90° phase shift in the opposite direction on said second Fourier components; combining said predetermined number of first Fourier components and said predetermined number of second Fourier components to provide said first output signal I; and combining the thus shifted first and second Fourier components to provide said second output signal Q.

2. Method according to claim 1, wherein said first Fourier components are fed into a circuit that is adapted to provide an in-line output signal and a +90° shifted output signal; wherein said second Fourier components are fed into a circuit that is adapted to provide an in-line output signal and a −90° shifted output signal; wherein said in-line output signals are added to provide said first output signal I; and wherein said +90° shifted output signal and said −90° shifted output signal are added to provide said second output signal Q.

3. Method according to claim 1, wherein said first Fourier components and said second Fourier components are provided by passing the input signal A through corresponding band pass filters.

4. Method according to claim 1, further comprising: providing a polyphase filter 10 having a transfer characteristic $H(\omega)=1$ and $H(-\omega)=0$ for each frequency $\omega$ in corresponding opposite sign rejecting (OSR) band pass regions around $(-1)^n/\omega_{2n+1}$ for n=1, 2, 3, ..., each band pass region having a bandwidth $BW_{2n+1}$ at least equal to (2n+1) times the width $BW_1$ of a portion of the first band pass region 41; feeding the input signal A to a first input of said polyphase filter; feeding a zero input signal to a second input of said polyphase filter; taking the first output signal I from a first output of said polyphase filter; and taking the second output signal Q from a second output (14) of said polyphase filter.

5. Phase-shifting network for generating two output signals (I, Q) corresponding to an input signal A at an input of the network, the output signals being mutually phase-shifted over 90°, the network comprising: first Fourier component selection means coupled to the input for selecting at least the fundamental wave $A_1(\omega_1)$ from the input signal A; second Fourier component selection means coupled to the input for selecting at least the third harmonic wave $A_3(\omega_3)$ from the input signal A; first means having an input, a first output, and a second output, the input being coupled to an output of the first Fourier component selection means, said first means being adapted for providing at its first output a first output signal comprising the Fourier components received at its input and for providing at its second output a second output signal containing the same Fourier components as the first output signal but shifted over +90°; second means having an input, a first output, and a second output, the input being coupled to an output of the second Fourier component selection means, said second means being adapted for providing at its second output a third output signal comprising the Fourier components received at its input and for providing at its first output a fourth output signal containing the same Fourier components as the third output signal but shifted over −90°; first combiner means having two inputs coupled with the first output of said first means and with the second output of said second means, respectively, and having an output coupled with a first output of the network; and second combiner means having two inputs coupled with the second output of said first means and with the first output of said second means, respectively, and having an output coupled with a second output of the network.

6. Phase-shifting network according to claim 5, wherein the first Fourier component selection means comprises a first band-pass filter having a central frequency $\omega_1$ and a bandwidth $BW_1$, and having an input coupled to said input; and the second Fourier component selection means comprises a second bandpass filter having a central frequency $\omega_3$ substantially equal to three times the central frequency $\omega_1$ of the first band-pass filter, and having a bandwidth $BW_3$ substantially equal to three times the bandwidth $BW_1$ of the first band-pass filter, said second band-pass filter having an input coupled to said input.

7. Phase-shifting network according to claim 6, wherein the first Fourier component selection means further comprises: a third band-pass filter having a central frequency $\omega_5$ substantially equal to five times the central frequency $\omega_1$ of the first band-pass filter, and having a bandwidth $BW_5$ substantially equal to five times the bandwidth $BW_1$ of the first band-pass filter, said third band-pass filter having an input coupled to said input; and a first adder having inputs coupled to outputs of the first and third bandpass filters.

8. Phase-shifting network according to claim 7, wherein the second Fourier component selection means further comprises: a fourth band-pass filter having a central frequency $\omega_7$ substantially equal to seven times the central frequency $\omega_1$ of the first band-pass filter, and having a bandwidth $BW_7$ substantially equal to seven times the bandwidth $BW_1$ of the first bandpass filter, said fourth band-pass filter having an input coupled to said input; and a second adder having inputs coupled to outputs of the second and fourth band-pass filters.

9. Phase-shifting network according to claim 8, wherein the first Fourier component selection means further comprises: for n=2, 4, 6, ... : further band-pass filters having a central frequency $\omega_1$ substantially equal to (2n+1) times the central frequency $\omega_1$ of the firsthand-pass filter, and having a bandwidth $BW_2$ substantially equal to (2n+1) times the bandwidth $BW_1$ of the first band-pass filter, each of said further band-pass filters having an input coupled to the said input and an output coupled to an input of said first adder; and wherein the second Fourier component selection means further comprises: for n=3, 5, 7, ... : further band-pass filters having a central frequency $\omega_{2n+1}$ substantially equal to (2n+1) times the central frequency $\omega_1$ of the first band-pass filter, and having a bandwidth $BW_{2n+1}$ substantially equal to (2n+1) times the bandwidth $BW_1$ of the first band-pass filter, each of said further band-pass filters having an input coupled to the said input and an output coupled to an input of said second adder.

10. Phase-shifting network according to claim 5, wherein said first means comprises a polyphase filter having a broadband normalized transfer characteristic $H(\omega)=1$ and $H(-\omega)=0$, and having another input receiving a zero input signal; and wherein said second means comprises a polyphase filter having a broadband normalized transfer characteristic $H(\omega)=1$ and $H(-\omega)=0$, and having another input recciving a zero input signal.

11. Phase-shifting network, comprising an input for receiving an input signal A from a local oscillator, the network being adapted for generating, at two outputs two output signals (I, Q) corresponding to the input signal A and being mutually phase-shifted over 90°, the network comprising: a polyphase filter having a first input, a second input, a first output and a second output; the first input of the polyphase filter being coupled to said input, and the second input of the polyphase filter being coupled to receive a zero signal; the first output of the polyphase filter being coupled to said first output for providing the first output signal I; the second output of the polyphase filter being coupled to said second output for providing the second output signal Q equal to the first output signal I but shifted over 90°; wherein the polyphase filter has a transfer characteristic with a first opposite sign rejecting (OSR) band-pass region having a central frequency $\omega_1$ and a bandwidth $BW_1$ and an associated rejection region having a central frequency $\omega_1$ and having a bandwidth $BW_5$; and wherein the transfer characteristic comprises a second OSR band-pass region having a central frequency $\omega_{42}$ substantially equal to $-3\,\omega_1$ and having a bandwidth $BW_{42}$, and an associated rejection region having a central frequency substantially equal to $3\,\omega_1$ and having a bandwidth $BW_{52}$.

12. Phase-shifting network according to claim 11, wherein the transfer characteristic of said polyphase filter comprises a predetermined number of further OSR band-pass regions, each of such further OSR band-pass regions having a central frequency substantially equal to $(-1)^n \cdot (2n+1)\omega_1$ and a bandwidth $BW_{2n+1}$, and associated rejection regions having a central frequency substantially equal to $(-1)^{n+1}/(2n+1)\omega_1$ and a bandwidth $BW_{2n+1}$.

13. Phase-shifting network according to claim 11, wherein the central frequency $\omega_1$ of the first OSR band-pass region is substantially equal to the central frequency $\omega_{LO}$ of an expected transmission band of the local oscillator, and wherein the bandwidth $BW_1$ of the first OSR band-pass region is at least equal to the expected bandwidth $BW_{LO}$ of said expected transmission band of the local oscillator; and wherein the bandwidth $BW_{2n+1}$ of the further OSR passband regions and corresponding rejection regions is at least equal to $(2n+1)$ times said expected bandwidth $BW_{LO}$ of said expected transmission band of the local oscillator (2; 102).

14. Device for providing two square-wave signals (I, Q) with mutual 90° phase difference, comprising a network according to claim 5, and a local oscillator coupled to the input of the network.

15. Device according to claim 14, wherein the local oscillator and the network together are implemented as an integrated circuit in one chip.

16. Device according to claim 14, wherein $\omega_1$ is substantially equal to the central frequency $\omega_{LO}$ of the local oscillator, and wherein $BW_1$ is substantially equal to the bandwidth $BW_{LO}$ of the local oscillator.

17. Apparatus for receiving and processing a modulated carrier wave, such as for instance a TV tuner or a telecommunication device, the apparatus comprising a phase-shifting network according to claim 5.

* * * * *